US011568800B2

(12) United States Patent
Yang et al.

(10) Patent No.: US 11,568,800 B2
(45) Date of Patent: *Jan. 31, 2023

(54) DISPLAY PANEL AND DISPLAY APPARATUS HAVING A LIGHT-TRANSMITTING DISPLAY AREA

(71) Applicant: WuHan TianMa Micro-Electronics Co., Ltd., Wuhan (CN)

(72) Inventors: Xingxing Yang, Wuhan (CN); Yangzhao Ma, Wuhan (CN)

(73) Assignee: WUHAN TIANMA MICRO-ELECTRONICS CO., LTD., Wuhan (CN)

(*) Notice: Subject to any disclaimer, the term of this patent is extended or adjusted under 35 U.S.C. 154(b) by 0 days.

This patent is subject to a terminal disclaimer.

(21) Appl. No.: 17/537,877

(22) Filed: Nov. 30, 2021

(65) Prior Publication Data

US 2022/0093038 A1  Mar. 24, 2022

Related U.S. Application Data

(63) Continuation of application No. 17/036,353, filed on Sep. 29, 2020, now Pat. No. 11,227,538.

(30) Foreign Application Priority Data

Jul. 20, 2020 (CN) .......................... 202010699581.8

(51) Int. Cl.
G09G 3/32  (2016.01)

(52) U.S. Cl.
CPC ....... *G09G 3/32* (2013.01); *G09G 2300/0426* (2013.01); *G09G 2300/0465* (2013.01);
(Continued)

(58) Field of Classification Search
CPC ... G09G 3/32–3291; G09G 2300/0426; G09G 2300/0439; G09G 2300/0452;
(Continued)

(56) References Cited

U.S. PATENT DOCUMENTS

2014/0015866 A1* 1/2014 Teranishi ............. G09G 3/2007
345/690
2017/0187976 A1* 6/2017 Cok ..................... G09G 3/3611
(Continued)

FOREIGN PATENT DOCUMENTS

| CN | 109742131 A | 5/2019 |
|---|---|---|
| CN | 110265455 A | 9/2019 |
| CN | 110444570 A | 11/2019 |

*Primary Examiner* — Nathan Danielsen
(74) *Attorney, Agent, or Firm* — Tarolli, Sundheim, Covell & Tummino LLP

(57) ABSTRACT

Provided is a display panel and a display apparatus, the display panel includes a first display area including a plurality of first light-emitting devices and a plurality of first pixel driving circuits; and a light-transmitting display area including a plurality of second light-emitting devices and a plurality of second pixel driving circuits. Each of the plurality of light-emitting devices is electrically connected to one of the plurality of first pixel driving circuits. Each of the second light-emitting devices is electrically connected to one of the plurality of second pixel driving circuits. The second pixel driving circuits electrically connected to the second light-emitting devices in at least two columns are located in the same column. The second pixel driving circuits located in the same column and connected to the second light-emitting devices in different columns are respectively connected to different data signal wires.

20 Claims, 10 Drawing Sheets

(52) U.S. Cl.
CPC ............ *G09G 2310/0275* (2013.01); *G09G 2320/0233* (2013.01); *G09G 2320/0686* (2013.01)

(58) Field of Classification Search
CPC ..... G09G 2300/046; G09G 2310/0202; G09G 2310/0213; G09G 2310/0232; G09G 2310/0262; G09G 2310/0264; G09G 2310/027; G09G 2310/0275; G09G 2310/0281; G09G 2310/04; G09G 2310/08; G09G 2320/0271; G09G 2320/0276; G09G 2320/0686; G09G 2320/10; G09G 2340/04–0428; G09G 2340/12; G09G 2340/14; G09G 2340/145; G09G 2354/00
See application file for complete search history.

(56) References Cited

U.S. PATENT DOCUMENTS

| | | | |
|---|---|---|---|
| 2019/0005868 A1* | 1/2019 | Xiao | G09G 3/2092 |
| 2020/0019747 A1* | 1/2020 | Yang | H01L 27/3276 |
| 2020/0265798 A1* | 8/2020 | Choi | H01L 27/3286 |
| 2021/0013298 A1* | 1/2021 | Her | H01L 27/3234 |
| 2021/0065625 A1* | 3/2021 | Wang | G09G 3/2074 |
| 2021/0201762 A1* | 7/2021 | He | H01L 27/3248 |

* cited by examiner

DISPLAY PANEL AND DISPLAY APPARATUS HAVING A LIGHT-TRANSMITTING DISPLAY AREA

CROSS-REFERENCE TO RELATED APPLICATIONS

The present application is a continuation of U.S. patent application Ser. No. 17/036,353, filed on Sep. 29, 2020, which claims priority to Chinese Patent Application No. 202010699581.8, filed on Jul. 20, 2020, the contents of both of which are incorporated herein by reference in their entireties.

TECHNICAL FIELD

The present disclosure relates to the field of display technologies and, in particular, to a display panel and a display apparatus.

BACKGROUND

With the rapid development of digital display products, in order to increase a screen-to-body ratio, a light-transmitting area needs to be provided in a display area of a display panel in order to provide light for an optical information collector under a screen. In order to achieve high light transmittance in the light-transmitting area, it is necessary to reduce a pixel density of the light-transmitting area and to arrange a driving circuit at an edge position of the light-transmitting area. After reducing the pixel density and shifting the driving circuit, how to reduce a width of the edge position of the light-transmitting area and how to use related driving integrated circuits to provide display signals for pixels at the same time has become an urgent problem to be solved.

SUMMARY

In view of this, the embodiments of the present disclosure provide a display panel and a display apparatus to solve the above problems.

In the first aspect, an embodiment of the present disclosure provides a display panel, and the display panel includes: a first display area including a plurality of first light-emitting devices and a plurality of first pixel driving circuits; and a light-transmitting display area including a plurality of second light-emitting devices and a plurality of second pixel driving circuits. Each of the plurality of light-emitting devices is electrically connected to one of the plurality of first pixel driving circuits. Each of the second light-emitting devices is electrically connected to one of the plurality of second pixel driving circuits. The second pixel driving circuits electrically connected to the second light-emitting devices in at least two columns are located in the same column. The second pixel driving circuits located in the same column and connected to the second light-emitting devices in different columns are respectively connected to different data signal wires.

In a second aspect, based on the same inventive concept, an embodiment of the present disclosure provides a display apparatus, the display apparatus includes a display panel, and the display panel includes: a first display area including a plurality of first light-emitting devices and a plurality of first pixel driving circuits; and a light-transmitting display area including a plurality of second light-emitting devices and a plurality of second pixel driving circuits. Each of the plurality of light-emitting devices is electrically connected to one of the plurality of first pixel driving circuits. Each of the second light-emitting devices is electrically connected to one of the plurality of second pixel driving circuits. The second pixel driving circuits electrically connected to the second light-emitting devices in at least two columns are located in the same column. The second pixel driving circuits located in the same column and connected to the second light-emitting devices in different columns are respectively connected to different data signal wires.

In a third aspect, based on the same inventive concept, an embodiment of the present disclosure provides a display panel, including: a first display area including a plurality of first light-emitting devices and a plurality of first pixel driving circuits; and a light-transmitting display area including a plurality of second light-emitting devices and a plurality of second pixel driving circuits. Each of the plurality of light-emitting devices is electrically connected to one of the plurality of first pixel driving circuits. Each of the second light-emitting devices is electrically connected to one of the plurality of second pixel driving circuits. Along a column direction, a density of the plurality of second pixel driving circuits is greater than a density of the plurality of first pixel driving circuits.

In a fourth aspect, based on the same inventive concept, an embodiment of the present disclosure provides a display apparatus, the display apparatus includes a display panel, and the display panel includes: a first display area including a plurality of first light-emitting devices and a plurality of first pixel driving circuits; and a light-transmitting display area including a plurality of second light-emitting devices and a plurality of second pixel driving circuits. Each of the plurality of light-emitting devices is electrically connected to one of the plurality of first pixel driving circuits. Each of the second light-emitting devices is electrically connected to one of the plurality of second pixel driving circuits. Along a column direction, a density of the plurality of second pixel driving circuits is greater than a density of the plurality of first pixel driving circuits.

In the display panel and the display apparatus according to the present disclosure, the second pixel driving circuits are centralized to a certain extent, such that distribution of the signal wires may be relatively more centralized and mainly distributed near the second pixel driving circuits, thereby avoiding excessively long and stray signal wires, and improving the light transmittance of the light-transmitting display area. In addition, the data signal wires electrically connected to the second pixel driving circuits in the same column electrically connected to different columns of the second light-emitting devices are different, it can be realized that different second pixel driving circuits in the same column may provide different data signals for the second light-emitting devices in different columns.

BRIEF DESCRIPTION OF DRAWINGS

In order to better illustrate technical solutions of embodiments of the present disclosure, the accompanying drawings used in the embodiments are described below. It is appreciated that, the drawings described below are merely some embodiments of the present disclosure.

DESCRIPTION OF EMBODIMENTS

The embodiments of the present disclosure are described in detail with reference to the drawings.

It should be clear that the described embodiments are merely part of the embodiments of the present disclosure rather than all of the embodiments.

The terms used in the embodiments of the present disclosure are merely for the purpose of describing particular embodiments and not intended to limit the present disclosure. Unless otherwise noted in the context, the singular form expressions "a", "an", "the" and "said" used in the embodiments and appended claims of the present disclosure are also intended to represent plural forms thereof.

The applicant of the present disclosure provided a solution to the problems in related technologies through careful and in-depth research.

Figure 1:
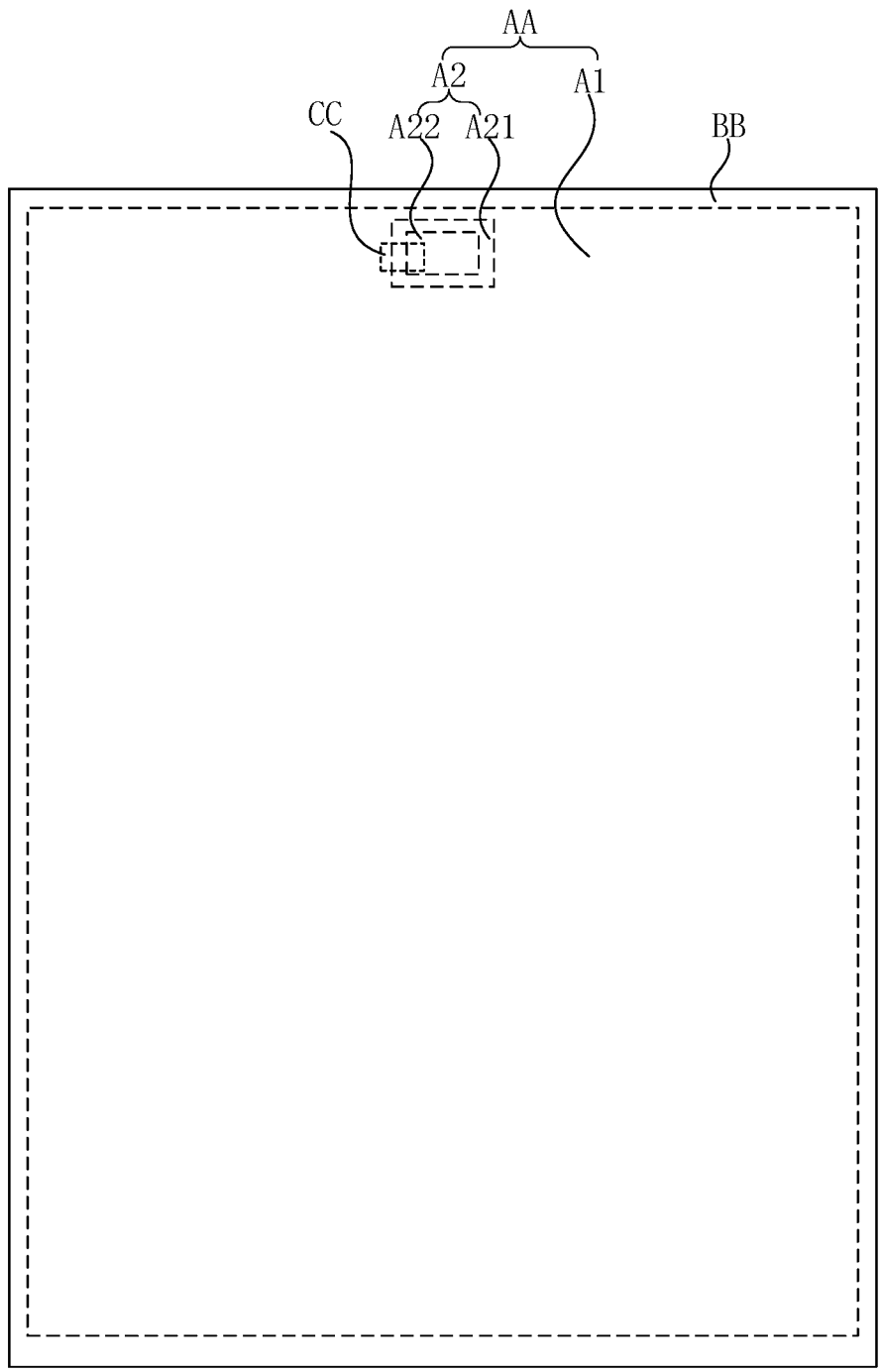
FIG. 1 is a schematic diagram of a display panel according to an embodiment of the present disclosure.
Figure 2:
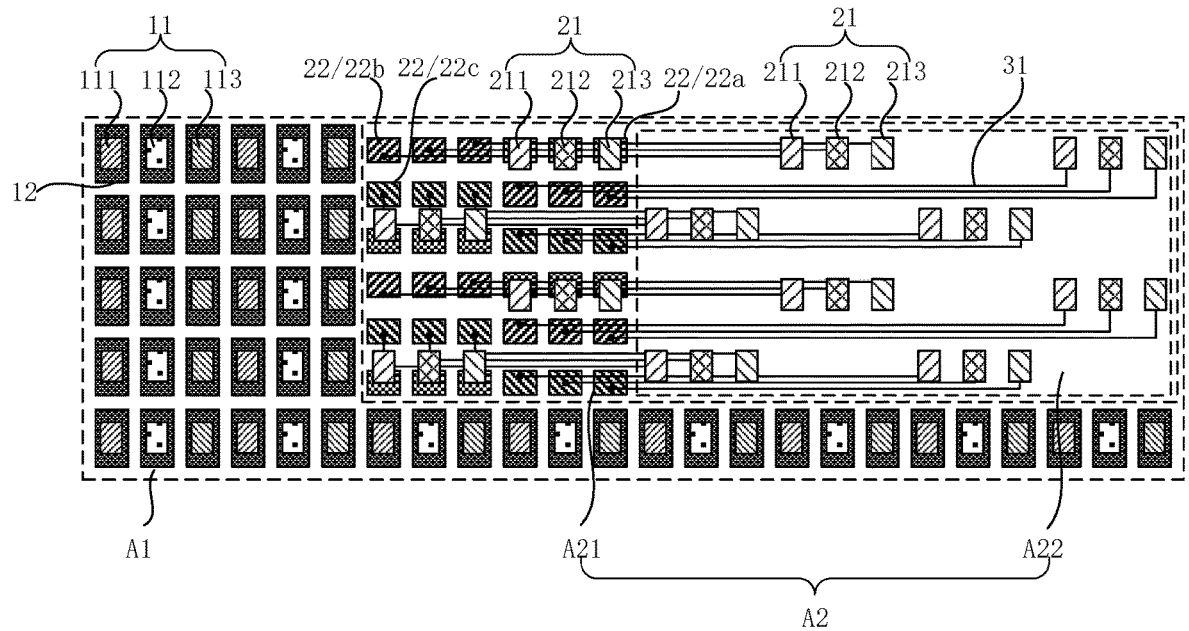
FIG. 2 is a partially enlarged diagram of a CC area of the display panel shown in FIG. 1.
Figure 3:
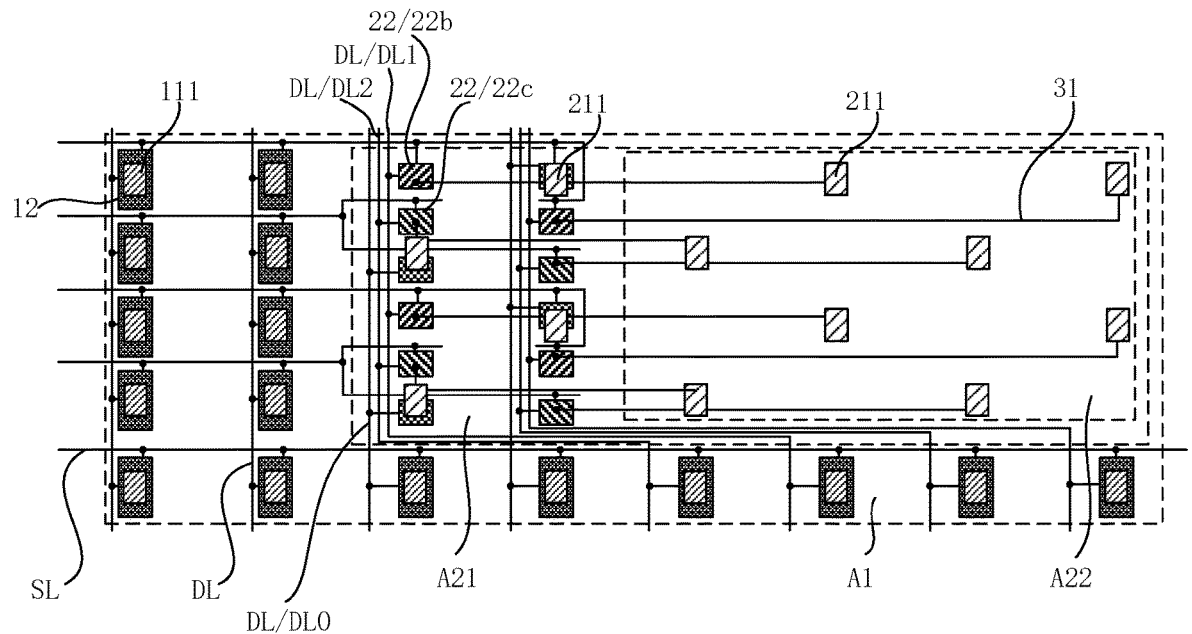
FIG. 3 is a partially enlarged diagram of a light-transmitting display area according to an embodiment of the present disclosure.

FIG. 1 is a schematic diagram of a display panel according to an embodiment of the present disclosure, FIG. 2 is a partially enlarged diagram of a CC area of the display panel shown in FIG. 1, and FIG. 3 is a partially enlarged diagram of a light-transmitting display area of the display panel according to an embodiment of the present disclosure.

As shown in FIG. 1, the display panel according to an embodiment of the present disclosure includes a display area AA and a non-display area BB surrounding the display area AA. The display area AA also includes a regular display area A1 and a light-transmitting display area A2, and the regular display area A1 may completely surround or semi-surround the light-transmitting display area A2. The regular display area A1 is configured for regular display, and the light-transmitting display area A2 may be configured for display and may also allow light beams other than light emitted by the display panel to be transmitted. For example, a camera may be provided at a position on a back side of the display panel corresponding to the light-transmitting display area A2, then light beams required for imaging by the camera may reach the camera from a front side of the display panel through the light-transmitting display area A2. The back side of the display panel or the position in the display panel corresponding to the light-transmitting display area A2 may also be provided with a biometric optical collector, then optical information reflected by biological tissues may reach the biometric optical collector via the light-transmitting display area A2. Therefore, the display panel according to the present disclosure may simultaneously realize a display function and an optical information collecting function, and the light-transmitting display area A2 is a part of the display area AA so that the display panel can realize full-screen display.

As shown in FIG. 2, the regular display area A1 includes a plurality of first pixel units 11 and a plurality of first pixel driving circuits 12 that are arranged in an array. The first pixel unit 11 may include a plurality kinds of first light-emitting devices, and the first light-emitting devices are electrically connected to the first pixel driving circuits 12. In an embodiment of the present disclosure, as shown in FIG. 2, the first pixel unit 11 includes a first-color first light-emitting device 111, a second-color first light-emitting device 112, and a third-color first light-emitting device 113, and the first-color first light-emitting device 111, the second-color first light-emitting device 112 and the third-color first light-emitting device 113 are electrically connected to the first pixel driving circuits 12, respectively. It should be noted that the first pixel unit 11 may further include more first light-emitting devices therein, for example, it may also include a white first light-emitting device. In addition, an arrangement manner of the first light-emitting devices in the first pixel unit 11 may be in a straight line as shown in FIG. 2, or it may also be in other arrangement manners such as a Chinese character "品" shape. Optionally, the first light-emitting devices and the first pixel driving circuits 12 are electrically connected in one-to-one correspondence. The first color, the second color, and the third color are respectively one of red, green, and blue and they differ from each other.

With reference to FIG. 2, the light-transmitting display area A2 includes a plurality of second pixel units 21 and a plurality of second pixel driving circuits 22, the second pixel unit 21 includes a plurality of second light-emitting devices, and the second light-emitting devices are electrically connected to the second pixel driving circuit 22. In an embodiment of the present disclosure, as shown in FIG. 2, the second pixel unit 21 includes a first-color second light-emitting device 211, a second-color second light-emitting device 212, and a third-color second light-emitting device 213, and the first-color second light-emitting device 211, the second-color second light-emitting device 212 and the third-color second light-emitting device 213 are electrically connected to the second pixel driving circuits 22, respectively. It should be noted that the second pixel unit 21 may further include more second light-emitting devices therein and, for example, it may also include a white second light-emitting device. In addition, an arrangement manner of the second light-emitting devices in the second pixel unit 21 may be in a straight line as shown in FIG. 2, or it may also be in other arrangement manners such as a Chinese character "品" shape. Optionally, the second light-emitting devices are electrically connected to the second pixel driving circuits 2 in one-to-one correspondence. The first color, the second color, and the third color are respectively one of red, green, and blue, and they differ from each other.

It should be noted that, in an embodiment of the present disclosure, a structure of the second pixel unit 21 and types and the number of the second light-emitting devices included may all be the same as a structure of the first pixel unit 11 and types and the number of the first light-emitting devices included. It should be further explained that, in an embodiment of the present disclosure, the first light-emitting device and the second light-emitting device may both be organic light-emitting devices. Moreover, the first light-emitting devices in the regular display area A1 are arranged on the corresponding first pixel driving circuit 12, and the two at least partially overlap along a thickness direction of the display panel.

As shown in FIG. 2, a density of the plurality of the second pixel units 21 arranged in the light-transmitting display area A2 is lower than a density of the plurality of the first pixel units 11 arranged in the regular display area A1. Moreover, the first pixel units 11 in the regular display area A1 may be arranged in a matrix. The second pixel units 21 in adjacent rows in the light-transmitting display area A2 are arranged in a staggered manner, that is, any two second pixel units 21 in adjacent rows are located in different columns. By setting the density of the second pixel units 21 to be smaller than the density of the first pixel units 11, good light transmittance of the light-transmitting display area A2 can be achieved. In addition, the staggered arrangement of the second pixel units 21 may ensure that light-emitting brightness of the light-transmitting display area A2 is more uniform so as to ensure a good display effect.

It should be noted that, since the plurality of the second pixel units 21 in the light-transmitting display area A2 are arranged in a staggered manner, same second light-emitting devices in the second pixel unit 21 are also arranged in a staggered manner. As shown in FIG. 2, the first-color second light-emitting devices 211 in adjacent rows are arranged in a staggered manner, the second-color second light-emitting devices 212 in adjacent rows are arranged in a staggered manner, and the third-color second light-emitting devices 213 in adjacent rows are also arranged in a staggered manner. For ease of understanding, the first-color second light-emitting device 211 is taken as an example to describe a connection manner of the second light-emitting devices and the corresponding second pixel driving circuit 21 and a design solution of the corresponding second pixel driving circuit below. However, it can be understood that solutions involved in following embodiments are also applicable to other second light-emitting devices in the second pixel unit 21.

As shown in FIG. 3, second pixel driving circuits 22 electrically connected to at least two columns of the second light-emitting devices are located in the same column, and in the same column, the second pixel driving circuits connected to different columns of the second light-emitting devices are respectively connected to different data signal wires DL. As shown in FIG. 3, multiple second pixel driving circuits 22 located in the same column include at least a first-type pixel driving circuit 22b and a second-type pixel driving circuit 22c. A data signal writing terminal of the first-type pixel driving circuit 22b is connected to a first data signal wire DL1, and a data signal writing terminal of the second-type pixel driving circuit 22c is connected to a second data signal wire DL2. In the first-type pixel driving circuit 22b and the second-type pixel driving circuit 22c located in the same column, the first-type pixel driving circuit 22b is electrically connected to the first-color second light-emitting device 211 in one column, and the second-type pixel driving circuit 22c is electrically connected to the first-color second light-emitting device 211 in another column.

In the present disclosure, although the second pixel units 21 are evenly arranged, that means, the first-color second light-emitting device 211, the second-color second light-emitting device 212, and the third-color second light-emitting device 213 are also evenly arranged, since the second pixel driving circuits 22 located in the same column include the second pixel driving circuits 22 electrically connected to different columns of the second light-emitting devices, then it is equivalent to that the second pixel driving circuits 22 are centralized to a certain extent. Relative to the case where the second pixel driving circuits 22 are evenly arranged, the centralized arrangement of the second pixel driving circuits 22 to a certain extent may make distribution of the signal wires more centralized and mainly distributed near the second pixel driving circuits, to avoid too long and stray signal wires, thereby improving the light transmittance of the light-transmitting display area A2.

In addition, although the second pixel driving circuits 22 in the same column include different second pixel driving circuits 22 electrically connected to different columns of the second light-emitting devices, the data signal wires that are electrically connected to the second pixel driving circuits 22 electrically connected to different columns of the second light-emitting devices are different, then it is possible that different second pixel driving circuits 22 in the same column can provide different data signals for the second light-emitting devices in different columns.

As shown in FIGS. 2 and 3, along a column direction, the density of the second pixel driving circuits 22 is larger than the density of the first pixel driving circuits 12, and in order to provide relatively more second pixel driving circuits 22 in limited space, an area of the second pixel driving circuit 22 is smaller than an area of the first pixel driving circuit 12.

Figure 4:
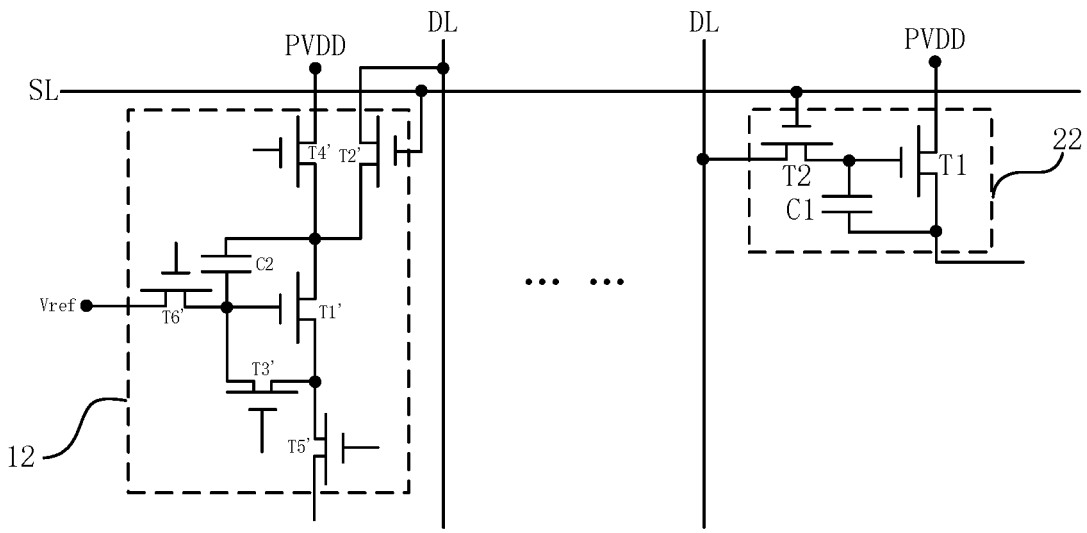
FIG. 4 is an equivalent circuit diagram of a pixel driving circuit according to an embodiment of the present disclosure.

FIG. 4 is an equivalent circuit diagram of a pixel driving circuit according to an embodiment of the present disclosure. As shown in FIG. 4, the first pixel driving circuit 12 and the second pixel driving circuit 22 each include a plurality of transistors. Optionally, the above-mentioned transistors are all thin film transistors (TFT).

In an embodiment of the present disclosure, a size of the transistor in the second pixel driving circuit 22 may be smaller than a size of the first pixel driving circuit 12, so that the area of the second pixel driving circuit 22 is smaller than the area of the first pixel driving circuit 12.

In another implementation manner of the present disclosure, as shown in FIG. 4, the number of the transistors included in the second pixel driving circuit 22 may be smaller than the number of the transistors included in the first pixel driving circuit 12, so that the area of the second pixel driving circuit is smaller than the area of the first pixel driving circuit 12.

Specific structures and working principles of the first pixel driving circuit 12 and the second pixel driving circuit 22 are described below. It should be noted that the pixel driving circuit provided in the present disclosure is not limited to the structures of the first pixel driving circuit 12 and the second pixel driving circuit 22 provided in the present embodiment.

As shown in FIG. 4, the second pixel driving circuit 22 includes a driving transistor T1, a data signal writing transistor T2, and a first capacitor C1. A source of the data signal writing transistor T2 is electrically connected to the data signal wire DL, for transmitting the data signal transmitted by the data signal wire DL to a gate of the driving transistor T1. A source of the driving transistor T1 receives a power supply voltage PVDD and generates a light-emitting driving current during a light-emitting phase, and the light-emitting driving current is output through a drain of the driving transistor T1 to the second light-emitting device to cause it to emit light.

As shown in FIG. 4, the first pixel driving circuit 12 includes a driving transistor T1', a data signal writing transistor T2', a threshold capture transistor T3', a power supply voltage writing transistor T4', a light-emitting control transistor T5', and a reset transistor T6' and a second capacitor C2. A source of the reset transistor T6' receives a reset voltage and resets a gate of the driving transistor T1' during a reset phase; a source of the data signal writing transistor T2' is electrically connected to the data signal wire DL, for transmitting, through the threshold capture transistor T3', the data signal transmitted by the data signal wire DL to the gate of the driving transistor T1'; a source of the power supply voltage writing transistor T4' receives the power supply voltage PVDD during the light-emitting phase, and the light-emitting control transistor T5' is turned on during the light-emitting phase, then the driving transistor T1' generates a light-emitting driving current, and the light-emitting driving current is output, through a drain of the driving transistor T1' and the light-emitting control transistor T5', to the first light-emitting device to cause it to emit light.

In an embodiment of the present disclosure, the second light-emitting devices electrically connected to one column of the second pixel driving circuits 22 are arranged in the same column as the second light-emitting devices electrically connected to another column of the second pixel driving circuits 22. As shown in FIG. 3, a first column of first-color second light-emitting devices 211 and a second column of the first-color second light-emitting devices 211 in a high light-transmitting display area A22 are both electrically connected to the first column of the second pixel driving circuits 22 in a transitional display area A21; a third column of the first-color second light-emitting devices 211 and a fourth column of the first-color second light-emitting devices 211 in the high light-transmitting display area A22 are both electrically connected to the second column of the second pixel driving circuits 22 in the transitional display area A21.

In addition, as shown in FIG. 2, although the density of the second pixel units 21 in the light-transmitting display area A2 is different from that of the first pixel units 11 in the regular display area A1, the number of columns of the second pixel units 21 in the light-transmitting display area A2 will not be more than the number of columns of the first pixel units 11 in the regular display area A1 having the same width as the light-transmitting display area A2. As shown in FIGS. 2 and 3, the number of columns of the second light-emitting devices in the light-transmitting display area A2 will not be more than the number of columns of the second light-emitting devices in the regular display area A1 having the same width as the light-transmitting display area A2, then the data signal wire in a portion of the regular display area A1 overlapping with the light-transmitting display area A2 in the column direction may extend to the light-transmitting display area A2. That is, the first data signal wire DL1 and the second data signal wire DL2 are both data signal wires extending from the regular display area A1 to the light-transmitting display area A2, and they provide data signals for a part of the first pixel driving circuits 12 and a part of the second pixel driving circuits 22 at the same time.

In an embodiment of the present disclosure, the second pixel driving circuit and the first pixel driving circuit respectively electrically connected to the second light-emitting device and the first light-emitting device that are located in the same column are electrically connected to the same data signal wire DL. As shown in FIG. 3, any column of the first-color second light-emitting devices 211 in the light-transmitting display area A2 are located in the same column as a column of the first-color first light-emitting devices 111 in the regular display area A1. Then, the second pixel driving circuit 22 and the first pixel driving circuit 12 respectively electrically connected to the first-color second light-emitting device 211 and the first-color first light-emitting device 111 that are located in the same column are electrically connected to the same data signal wire DL. Therefore, the regular display of the light-transmitting display area A2 may be realized without changing the number of the data signal wires and designs of integrated circuits.

In an embodiment of the present disclosure, with reference to FIG. 2, although the density of the second pixel units 21 in the light-transmitting display area A2 is different from that of the first pixel units 11 in the regular display area A1, the number of rows of the second pixel unit 21 in the light-transmitting display area A2 will not be more than the number of rows of the first pixel unit 11 in the regular display area A1 having the same height as the light-transmitting display area A2. As shown in FIGS. 2 and 3, the number of rows of the second light-emitting devices in the light-transmitting display area A2 will not be more than the number of rows of the second light-emitting devices in the regular display area A1 having the same height as the light-transmitting display area A2, then a scan wire SL in a portion of the regular display area A1 overlapping with the light-transmitting display area A2 in a row direction may extend to the light-transmitting display area A2. That is, the scan wire SL that provides a scan signal for the second pixel driving circuit 22 extends from the regular display area A1 to the light-transmitting display area A2, and it provides the scan signal for a part of the first pixel driving circuits 12 and a part of the second pixel driving circuits 22 at the same time.

In an embodiment of the present disclosure, the second pixel driving circuit and the first pixel driving circuit respectively electrically connected to the second light-emitting device and the first light-emitting device that are located in the same row are electrically connected to the same scan wire SL. As shown in FIG. 3, any row of the first-color second light-emitting devices 211 in the light-transmitting display area A2 are located in the same row as a row of the first-color first light-emitting devices 111 in the regular display area A1. Then, the second pixel driving circuit 22 and the first pixel driving circuit 12 respectively electrically connected to the first-color second light-emitting device 211 and the first-color first light-emitting device 111 that are located in the same row are electrically connected to the same scan wire SL. Therefore, the regular display of the light-transmitting display area A2 may be realized without changing the number of the scan wires and the designs of the integrated circuits.

In an embodiment of the present disclosure, referring to FIGS. 1 to 3, the light-transmitting display area A2 includes a transitional display area A21 and a high light-transmitting display area A22, the transitional display area A21 is located between the regular display area A1 and the high light-transmitting display area A22, and the second pixel driving circuits 22 are all arranged in the transitional display area A21. In other words, the second pixel units 21 in the light-transmitting display area A2 are still evenly distributed, however, all the second pixel driving circuits 22 electrically connected to all the second light-emitting devices 21 are arranged in the transitional display area A21 in the light-transmitting display area A2 rather than the high light-transmitting display area A22, so that the transmittance of the high light-transmitting display area A22 in the light-transmitting display area A2 is further improved. Due to relatively large differences in brightness and transmittance between the regular display area A1 and the high light-transmitting display area A22, the transitional display area A21 is provided between the two, such that changes in brightness and transmittance from the regular display area A1 to the high light-transmitting display area A22 can be buffered, thereby avoiding obvious display differences from affecting viewing experiences of the users. In addition, in the transitional display area A21, the second pixel driving circuits 22 electrically connected to the second light-emitting devices in different columns are arranged in the same column, then all the second pixel driving circuits 22 may be arranged in relatively narrow space, to prevent the width of the transitional display area A21 from being relatively wide, thereby improving the display effect of the display panel.

In an embodiment of the present disclosure, when the light-transmitting display area A2 includes the transitional display area A21 and the second pixel driving circuits 22 are disposed in the transitional display area A21, adjacent N rows of the second pixel units 21 are arranged in a staggered manner, then the first-type pixel driving circuit to the Nth-type pixel driving circuit may be arranged in one column of the second pixel driving circuits 22. In the first-type pixel driving circuit to the Nth-type pixel driving circuit that are arranged in the same column, data signal input terminals of the first-type pixel driving circuit to the Nth-type pixel driving circuit are respectively connected to the first data signal wire to the Nth data signal wire, and the first-type pixel driving circuit to the Nth-type pixel driving circuit are respectively electrically connected to N columns of the second light-emitting devices in the high light-transmitting display area A22. N≥2, and N is a positive integer.

Figure 5:
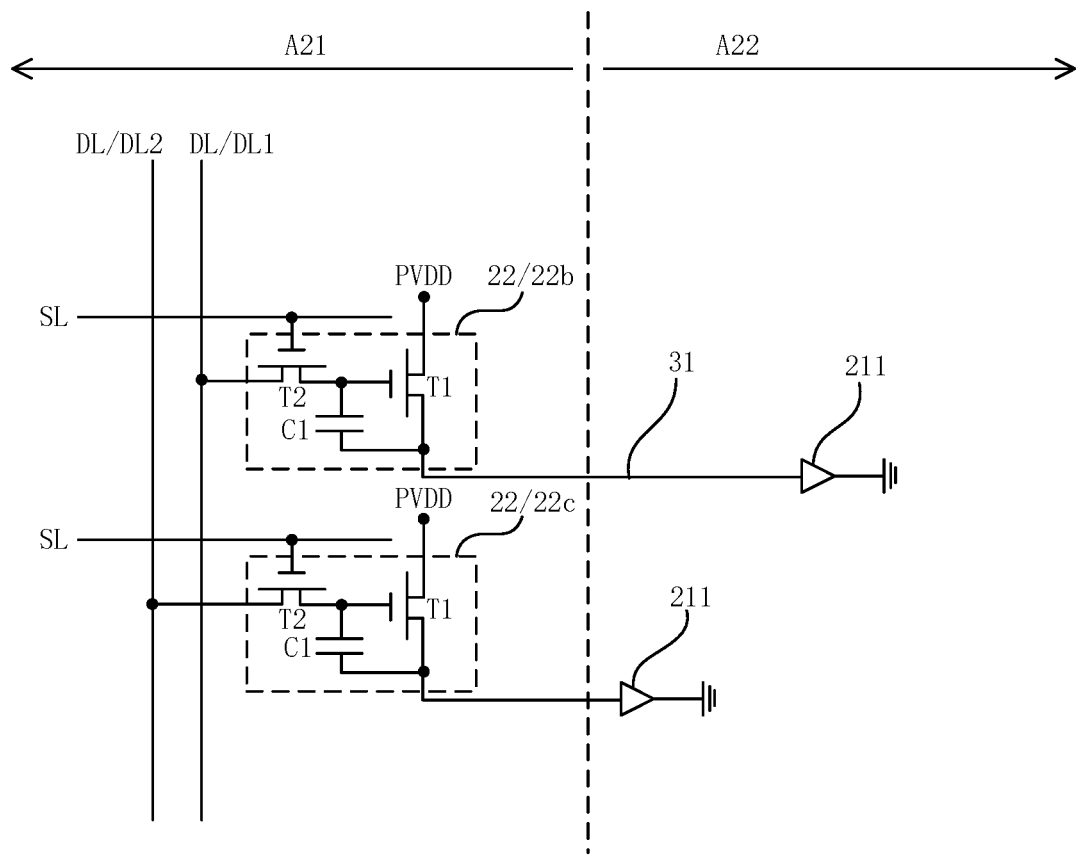
FIG. 5 is a partially detailed enlarged diagram of a light-transmitting display area according to an embodiment of the present disclosure.

FIG. 5 is a partially detailed enlarged diagram of a light-transmitting display area according to an embodiment of the present disclosure. As shown in FIG. 3 and FIG. 5, N=2, then two adjacent rows of the second pixel units are arranged in a staggered manner, and every two rows form one repeating unit, then the plurality of the second pixel driving circuits 22 located in the same column include a first-type pixel driving circuit 22b and a second-type pixel driving circuit 22c. In addition, in the first-type pixel driving circuit 22b and the second-type pixel driving circuit 22c that are located in the same column, the first-type pixel driving circuit 22b is connected to the first data signal wire DL1 and electrically connected to one column of the first-color second light-emitting devices 211 in the high light-transmitting display area A22, and the second-type pixel driving circuit 22c is connected to the second data signal wire DL2 and electrically connected to another column of the first-color second light-emitting devices 211 in the high light-transmitting display area A22.

Figure 6:
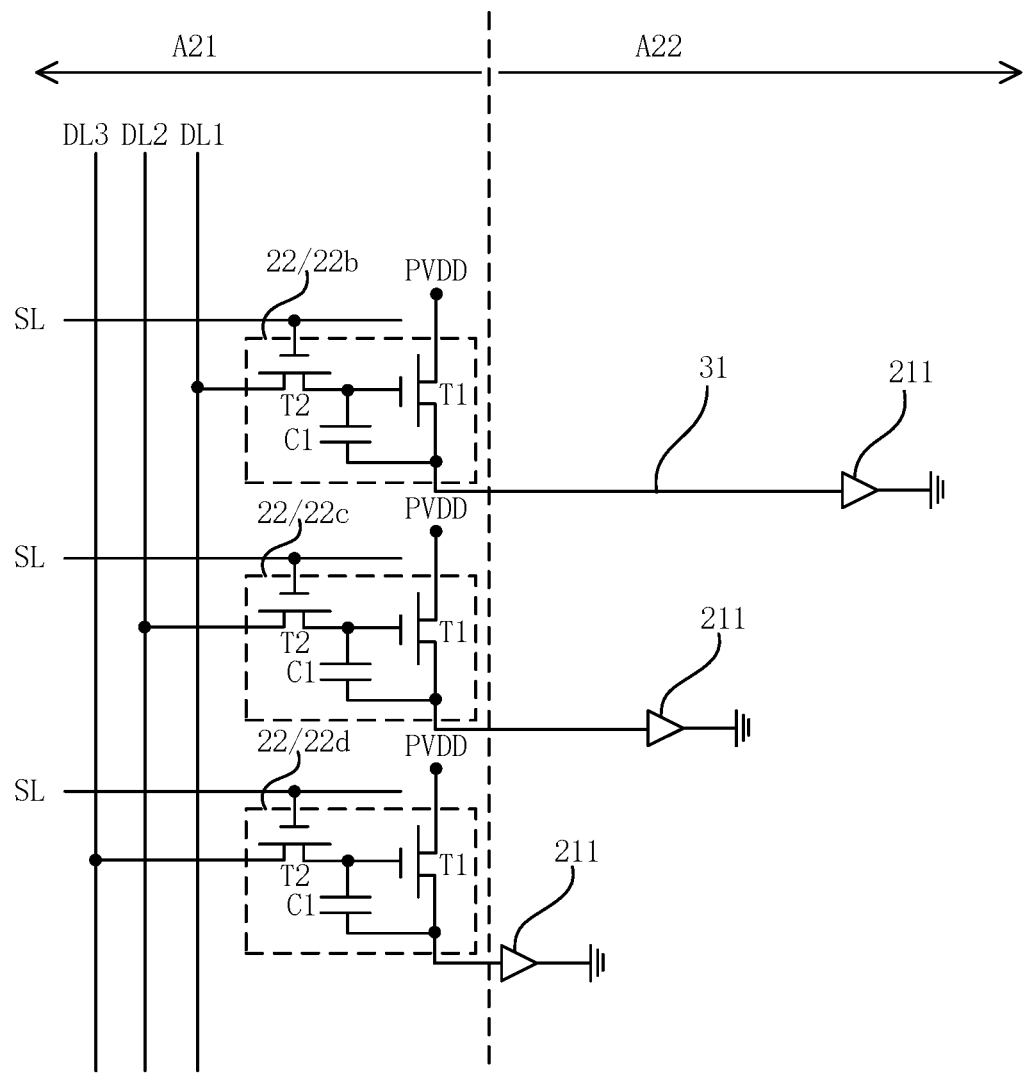
FIG. 6 is a partially detailed enlarged diagram of another light-transmitting display area according to an embodiment of the present disclosure.

FIG. 6 is a partially detailed enlarged diagram of another light-transmitting display area according to an embodiment of the present disclosure. As shown in FIG. 6, N=3, then three adjacent rows of the second pixel units are arranged in a staggered manner, and every three rows form one repeating unit, then the plurality of the second pixel driving circuits 22 located in the same column include a first-type pixel driving circuit 22b, a second-type pixel driving circuit 22c, and a third-type pixel driving circuit 22d. In addition, in the first-type pixel driving circuit 22b, the second-type pixel driving circuit 22c and the third-type pixel driving circuit 22d that are located in the same column, the first-type pixel driving circuit 22b is connected to the first data signal wire DL1 and electrically connected to one column of the first-color second light-emitting devices 211 in the high light-transmitting display area A22, the second-type pixel driving circuit 22c is connected to the second data signal wire DL2 and electrically connected to another column of the first-color second light-emitting devices 211 in the high light-transmitting display area A22, and the third-type pixel driving circuit 22d is connected to the third data signal wire DL3 and electrically connected to still another column of the first-color second light-emitting devices 211 in the high light-transmitting display area A22.

Referring to FIGS. 2 to 3, when the light-transmitting display area A2 includes the transitional display area A21 and the second pixel driving circuit 22 is disposed in the transitional display area A21, the plurality of the second pixel driving circuits located in the same column further include an in-situ pixel driving circuit 22a. The in-situ pixel driving circuits 22a in the same column are electrically connected to an in-situ data signal wire DL0 and electrically connected to the second light-emitting devices located in the transitional display area A21. The in-situ pixel driving circuits 22a electrically connected to the second light-emitting devices located in the same column in the transitional display area A21 are located in the same column, the second light-emitting device in the transitional display area A21 is arranged over the corresponding in-situ pixel driving circuit 22a, and a projection of the second light-emitting device located in the transitional display area A21 partially overlaps a projection of the corresponding in-situ pixel driving circuit 22a along the thickness direction of the display panel.

Referring to FIG. 3, a plurality of the second pixel driving circuits 22 in the same column include: the first-type pixel driving circuit 22b connected to the first data signal wire DL1 and electrically connected to one column of the first-color second light-emitting devices 211 in the high light-transmitting display area A22, the second-type pixel driving circuit 22c connected to the second data signal wire DL2 and electrically connected to another column of the first-color second light-emitting devices 211 in the high light-transmitting display area A22, and the in-situ pixel driving circuit 22a connected to the in-situ data signal wire DL0 and electrically connected to the first-color second light-emitting device 211 in the transitional display area A21.

It should be noted that the in-situ data signal wire DL0 is also the data signal wire DL extending from the regular display area A1 to the transitional display area A21. Moreover, in an embodiment of the present disclosure, as shown in FIG. 3, the first pixel driving circuit 12 and the in-situ pixel driving circuit 22a that are electrically connected to any one of the in-situ data signal wires DL0 are located in the same column, and the first light-emitting device and the second light-emitting device respectively electrically connected to the first pixel driving circuit 12 and the in-situ pixel driving circuit 22a that are located in the same column are also located in the same column.

In an embodiment of the present disclosure, referring to FIG. 2 and FIG. 3. The second pixel driving circuit 22 electrically connected to the second light-emitting device in the high light-transmitting display area A22 is electrically connected to the second light-emitting device through a connecting electrode 31, and the connecting electrode 31 may be a transparent conductive electrode.

Figure 7:
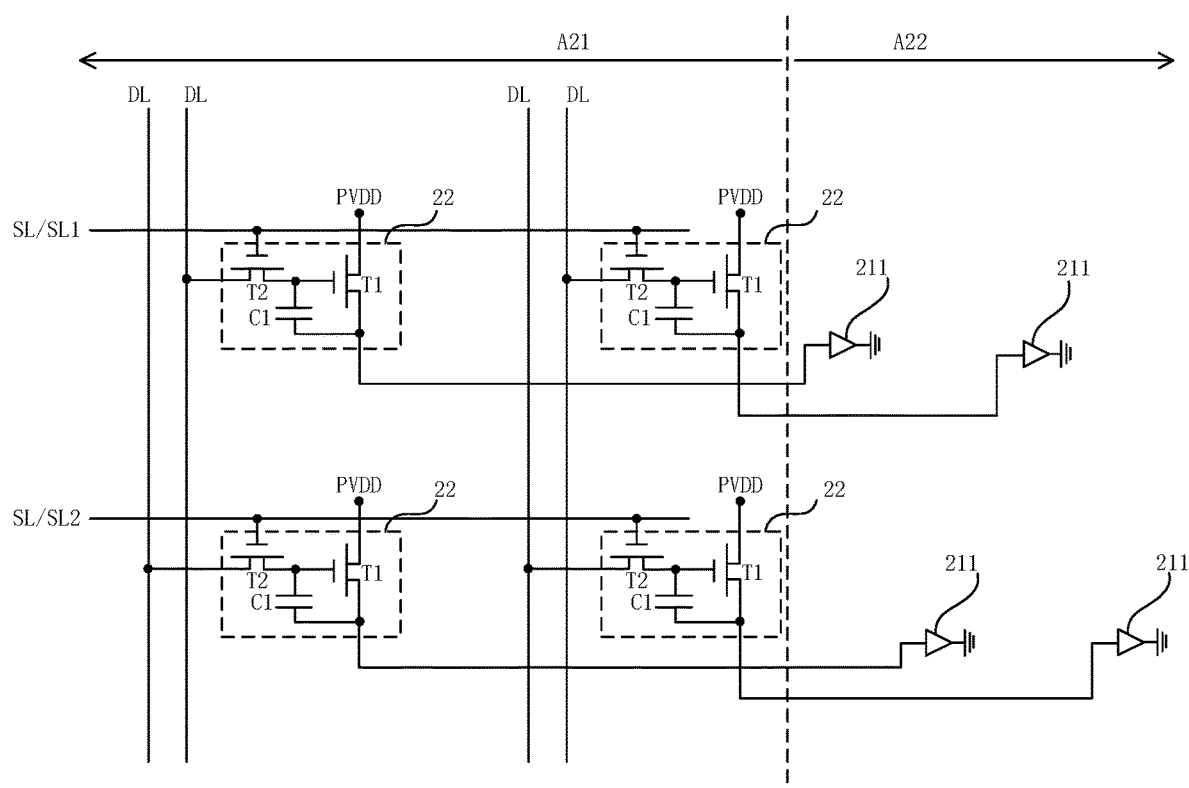
FIG. 7 is a partially detailed enlarged diagram of still another light-transmitting display area according to an embodiment of the present disclosure.

FIG. 7 is a partially detailed enlarged diagram of still another light-transmitting display area according to an embodiment of the present disclosure. In an embodiment of the present disclosure, when the light-transmitting display area A2 includes a transitional display area A21 and a high light-transmitting display area A22 and the second pixel driving circuit 22 is disposed in the transitional display area A21, the second pixel driving circuits electrically connected to the second light-emitting devices located in the same row in the high light-transmitting display area A22 are each located in different columns. As shown in FIGS. 2, 3, and 7, in the high light-transmitting display area A22, the second pixel driving circuits 22 electrically connected to the two first-color second light-emitting devices 211 located in the same row are respectively located in different columns.

Figure 8:
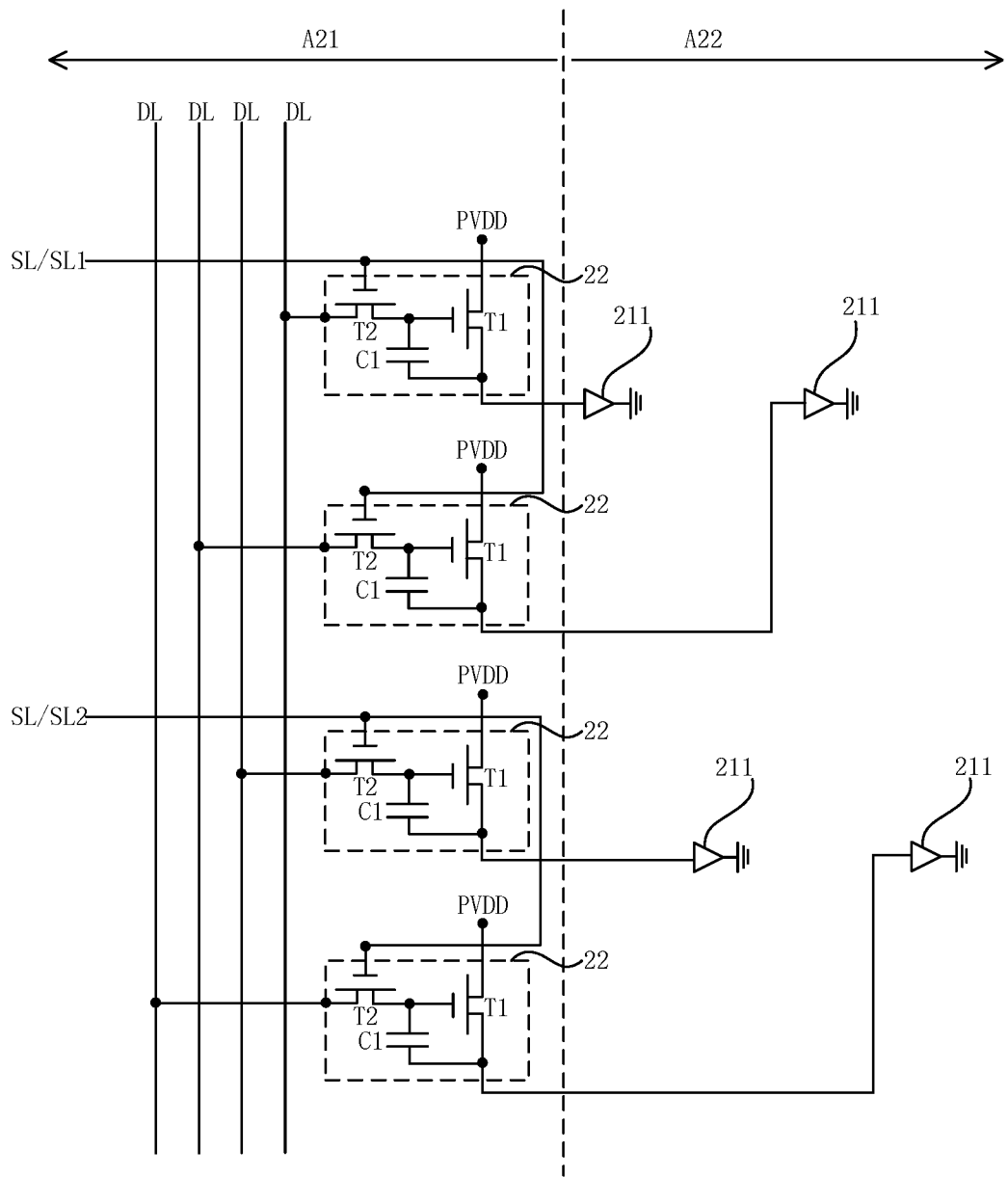
FIG. 8 is a partially detailed enlarged diagram of yet still another light-transmitting display area according to an embodiment of the present disclosure.

FIG. 8 is a partially detailed enlarged diagram of yet still another light-transmitting display area according to an embodiment of the present disclosure. In an embodiment of the present disclosure, when the light-transmitting display area A2 includes a transitional display area A21 and a high light-transmitting display area and the second pixel driving circuit 22 is disposed in the transitional display area A21, the second pixel driving circuits 22 electrically connected to at least two second light-emitting devices located in the same row in the high light-transmitting display area A22 are arranged in the same column. As shown in FIG. 8, in the high light-transmitting display area A22, the second pixel driving circuits 22 electrically connected to the two first-color second light-emitting devices 211 located in the same row are located in the same column. For example, in the high light-transmitting display area A22, the number of the first-color second light-emitting devices 211 located in the same row is M, then the second pixel driving circuits 22 electrically connected to the M first-color second light-emitting devices 211 may be distributed in R columns, where R≤M.

In an embodiment, the second pixel driving circuits 22 electrically connected to the M first-color second light-emitting devices 211 located in the same row are arranged in M/R rows, and a value of the M/R may be a positive integer, for example, M/R=3, then a ratio of the width of the transitional display area A21 to the width of the high light-transmitting display area A22 may also be M/R. That is, the second pixel driving circuits 22 electrically connected to the M first-color second light-emitting devices 211 located in the same row are located in plurality of rows.

In an embodiment of the present disclosure, when the second pixel driving circuits 22 electrically connected to the second light-emitting devices of the same color in the same row are located in plurality of rows, in order to ensure that the second light-emitting devices of the same color in the same row can emit light at the same time, then the second pixel driving circuits 22 electrically connected to the second light-emitting devices of the same color in the same row can simultaneously receive a scan signal, that is, gates of the respective transistors having the same function in the second pixel driving circuits 22 electrically connected to the second light-emitting devices of the same color in the same row receive the scan signal simultaneously. In an embodiment, in order to ensure that the gates of the respective transistors having the same function in the second pixel driving circuits 22 electrically connected to the second light-emitting devices of the same color in the same row are electrically connected to or share a scan signal wire, as shown in FIG. 8, in the high light-transmitting display area A22, the second pixel driving circuits 22 electrically connected to the two first-color second light-emitting devices 211 located in the same column, that is, located in two rows, and the gates of the data signal writing transistors T2 in the two rows of the second pixel driving circuits 22 share one scan wire.

Figure 9:
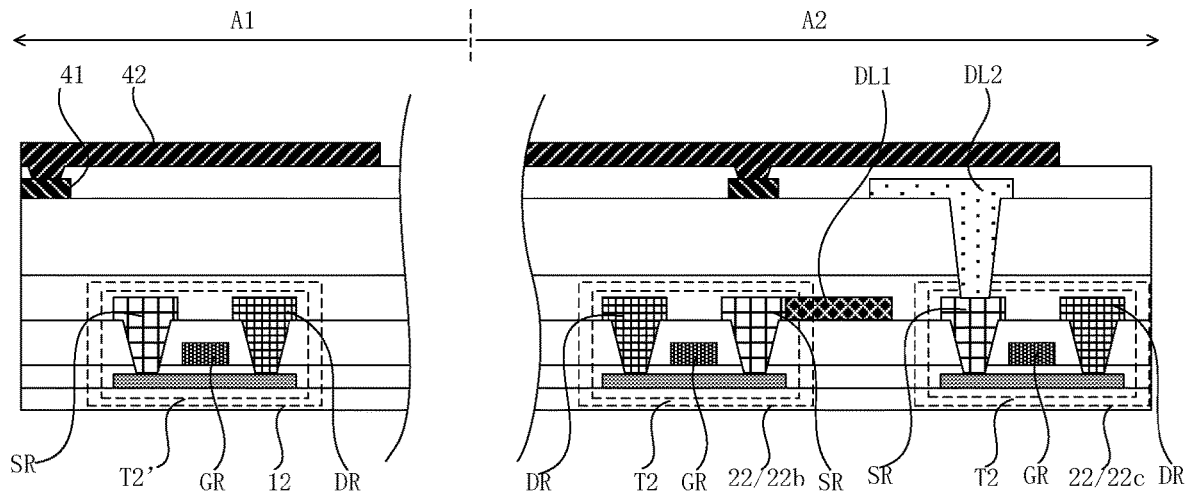
FIG. 9 is a partially cross-sectional diagram of a display panel according to an embodiment of the present disclosure.
Figure 10:
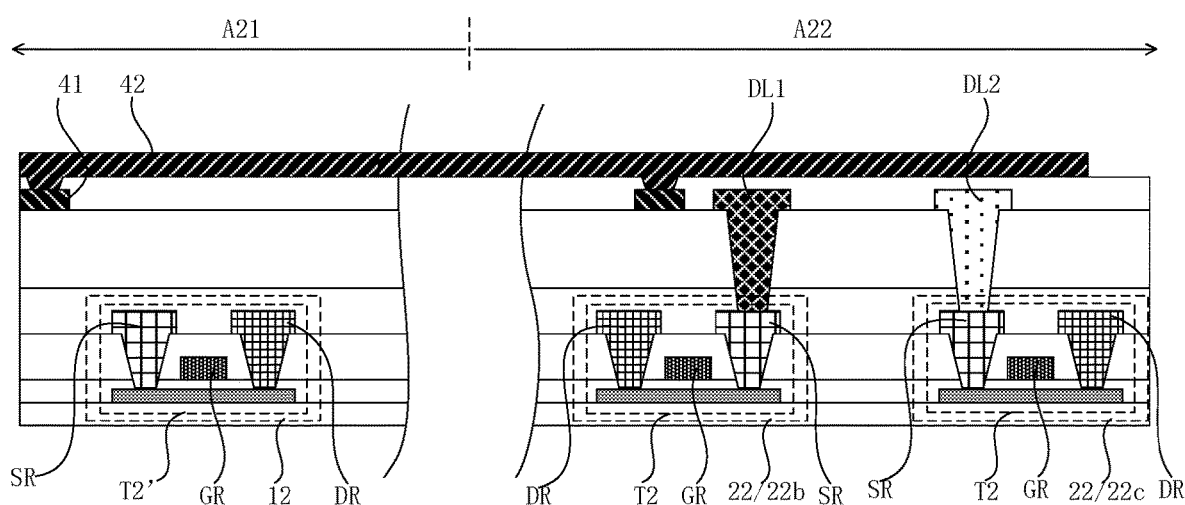
FIG. 10 is a partially cross-sectional diagram of another display panel according to an embodiment of the present disclosure.

FIG. 9 is a partially cross-sectional diagram of a display panel according to an embodiment of the present disclosure, and FIG. 10 is a partially cross-sectional diagram of another display panel according to an embodiment of the present disclosure. As stated in the above embodiments, the first pixel driving circuit 12 and the second pixel driving circuit 22 in the present disclosure both include transistors, and the transistors each include a gate and a source located on different metal film layers. As shown in FIGS. 9 and 10, gates GR and sources SR included in the data signal writing transistor T2' in the first pixel driving circuit 12 and the data signal writing transistor T2 in the second pixel driving circuit 22 are located in different film layers.

In an embodiment of the present disclosure, at least one of the plurality of the data signal wires DL corresponding to the second pixel driving circuits 22 in the same column is located on a different metal film layer from the gate and the source. As shown in FIGS. 9 and 10, at least one of the first data signal wire DL1 and the second data signal wire DL2 corresponding to the second pixel driving circuits 22 in the same column is located on a different metal film layer from the gate and the source.

In an embodiment of the present disclosure, as shown in FIG. 9, in the first-type pixel driving circuit 22b and the second-type pixel driving circuit 22c located in the same column, the first data signal wire DL1 connected to the source SR of the data signal writing transistor T2 in the first-type pixel driving circuit 22b and the second data signal wire DL2 connected to the source SR of the data signal writing transistor T2 in the second-type pixel driving circuit 22c are located in different layers, and the first data signal wire DL1 and the source SR are arranged in the same layer, and the second data signal wire DL2 is arranged in a layer respectively different from that of the source SR and that of the gate GR.

In an embodiment of the present disclosure, as shown in FIG. 10, in the first-type pixel driving circuit 22b and the second-type pixel driving circuit 22c located in the same column, the first data signal wire DL1 connected to the source SR of the data signal writing transistor T2 in the first-type pixel driving circuit 22b and the second data signal wire DL2 connected to the source SR of the data signal writing transistor T2 in the second-type pixel driving circuit 22c are located in the same layer, and the first data signal wire DL1 and the second data signal wire DL2 are located in a layer respectively different from that of the source SR and that of the gate GR.

When one, which is arranged in a different layer from the gate and the source, of the first data signal wire DL1 and the second data signal wire DL2 that are corresponding to the second pixel driving circuits 22 in the same column may partially overlap, in the thickness direction of the display panel, the second pixel driving circuit 22 or the signal wire corresponding to the second pixel driving circuit 22, then a light-transmitting area of the light-transmitting display area A2 may be increased while ensuring that a plurality of the data signal wires may be arranged in limited space between adjacent columns of the second pixel driving circuits 22.

With reference to FIG. 9 and FIG. 10, the display panel also includes a touch layer, the touch layer includes a touch electrode layer and a touch trace layer, the touch electrode layer includes a plurality of the touch electrodes 42 insulated from each other, the touch trace layer includes a plurality of touch traces 41, and the touch electrode 42 is electrically connected to at least one of the touch traces 41.

In an embodiment of the present disclosure, at least one of multiple data signal wires corresponding to the second pixel driving circuits 22 in the same column is provided in the same layer as the touch trace 41.

Figure 11:
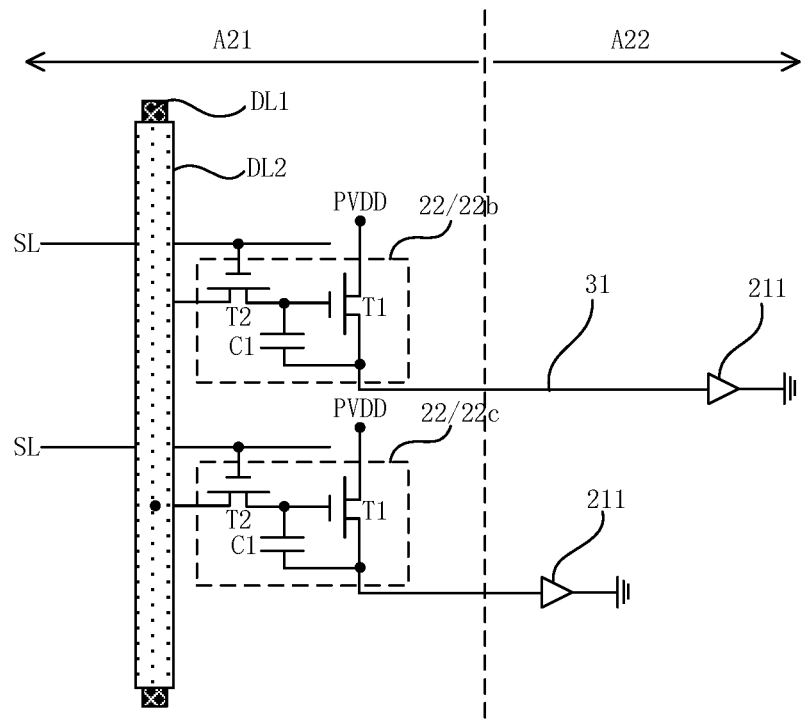
FIG. 11 is a schematic plan diagram of a light-transmitting display area according to an embodiment of the present disclosure.

FIG. 11 is a schematic plan diagram of a light-transmitting display area according to an embodiment of the present disclosure. As shown in FIG. 9, in the first-type pixel driving circuit 22b and the second-type pixel driving circuit 22c located in the same column, the first data signal wire DL1 connected to the source SR of the data signal writing transistor T2 in the first-type pixel driving circuit 22b is located in the same metal film layer as the source SR; the second data signal wire DL2 connected to the source SR of the data signal writing transistor T2 in the second-type pixel driving circuit 22c is located in the same metal film layer as the touch trace 41. As shown in FIGS. 9 and 11, the second data signal wire DL2 and the first data signal wire DL1 corresponding to the second pixel driving circuits 22 in the same column at least partially overlap in the thickness direction of the display panel.

Figure 12:
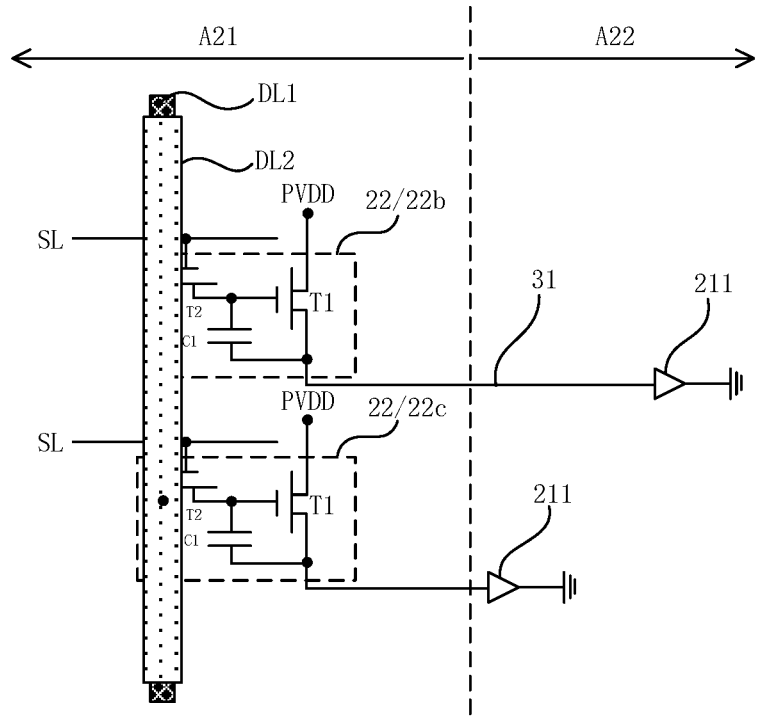
FIG. 12 is a schematic plan diagram of another light-transmitting display area according to an embodiment of the present disclosure.

FIG. 12 is a schematic plan diagram of another light-transmitting display area according to an embodiment of the present disclosure. As shown in FIG. 10, in the first-type pixel driving circuit 22b and the second-type pixel driving circuit 22c located in the same column, the first data signal wire DL1 connected to the source SR of the data signal writing transistor T2 in the first-type pixel driving circuit 22b and the second data signal wires DL2 connected to the source SR of the data signal writing transistor T2 in the second-type pixel driving circuit 22c are both arranged in the same layer as the touch trace 41. As shown in FIGS. 10 and 12, both the second data signal wire DL2 and the first data signal wire DL1 corresponding to the second pixel driving circuits 22 in the same column at least partially overlap with the second pixel driving circuit 22 in the thickness direction of the display panel.

In an embodiment of the present disclosure, as shown in FIGS. 5-8, the second pixel driving circuit 22 includes a data signal writing transistor T2, and a source of the data signal writing transistor T2 is electrically connected to the data signal wire DL. The data signal writing transistors T2 included in the second pixel driving circuits 22 of the same column are located on the same side of the multiple data signal wires DL corresponding to the column of second pixel driving circuits 22. As shown in FIGS. 5-8, the data signal writing transistors T2 included in the same column of the second pixel driving circuits 22 are located on a right side of the data signal wires DL corresponding to the column of the second pixel driving circuits 22.

Figure 13:
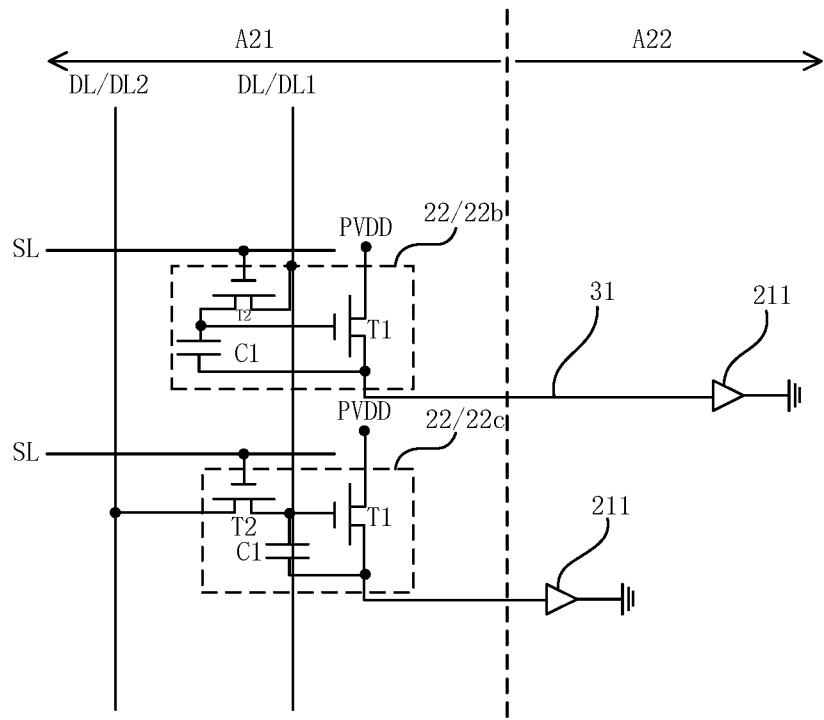
FIG. 13 is a schematic plan diagram of still another light-transmitting display area according to an embodiment of the present disclosure.
Figure 14:
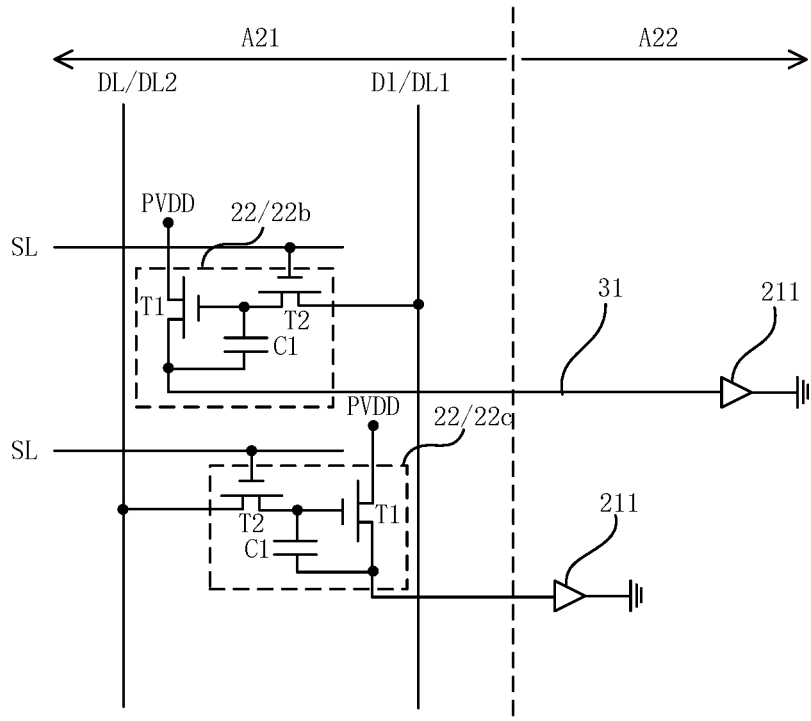
FIG. 14 is a schematic plan diagram of yet still another light-transmitting display area according to an embodiment of the present disclosure.

FIG. 13 is a schematic plan diagram of still another light-transmitting display area according to an embodiment of the present disclosure, and FIG. 14 is a schematic plan diagram of yet still another light-transmitting display area according to an embodiment of the present disclosure. As shown in FIGS. 13 and 14, the second pixel driving circuit 22 includes a data signal writing transistor T2, and a source of the data signal writing transistor T2 is electrically connected to the data signal wire DL. The data signal writing transistors T2 included in the second pixel driving circuits 22 of the same column are located between two data signal wires corresponding to the column of the second pixel driving circuits 22. As shown in FIG. 13 and FIG. 14, the first-type pixel driving circuit 22b and the second-type pixel driving circuit 22c located in the same column are both located between the first data signal wire DL1 and the second data signal wire DL2 corresponding to the column of the pixel driving circuits 22. Disposing different data signal wires DL corresponding to the second pixel driving circuits 22 in the same column on different sides of the data signal writing transistor T2 makes it easy to realize the electrical connection between different data signal wires DL and the source SR.

As shown in FIG. 13, in an embodiment, in the second pixel driving circuits 22 of the same column, the data signal writing transistors are located on the same side of the column of the second pixel driving circuits 22. As shown in FIG. 13, in the second pixel driving circuits 22 in the same column, the data signal writing transistor T2 electrically connected to the first data signal wire DL1 and the data signal writing transistor T2 electrically connected to the second data signal wire DL2 are both located on the left side of the second pixel driving circuits 22. Moreover, in order to realize that different data signal wires DL corresponding to the second pixel driving circuits 22 of the same column are arranged on different sides of the data signal writing transistors T2, an arrangement direction of the source SR and the drain DR of the data signal writing transistor T2 electrically connected to the first data signal wire DL1 is opposite to an arrangement direction of the source SR and the drain DR of the data signal writing transistor T2 electrically connected to the second data signal wire DL2.

In an embodiment, in the second pixel driving circuits 22 of the same column, the data signal writing transistors are respectively located on different sides of the column of the second pixel driving circuits 22. As shown in FIG. 14, in the second pixel driving circuits 22 in the same column, the data signal writing transistors T2 electrically connected to the first data signal wire DL1 are located on a first side of the column of the second pixel driving circuits 22, the data signal writing transistors T2 electrically connected to the second data signal wire DL2 are located on a second side of the second pixel driving circuits 22, and the first side and the second side may be two opposite sides of the second pixel driving circuits 22 along the row direction.

Figure 15:
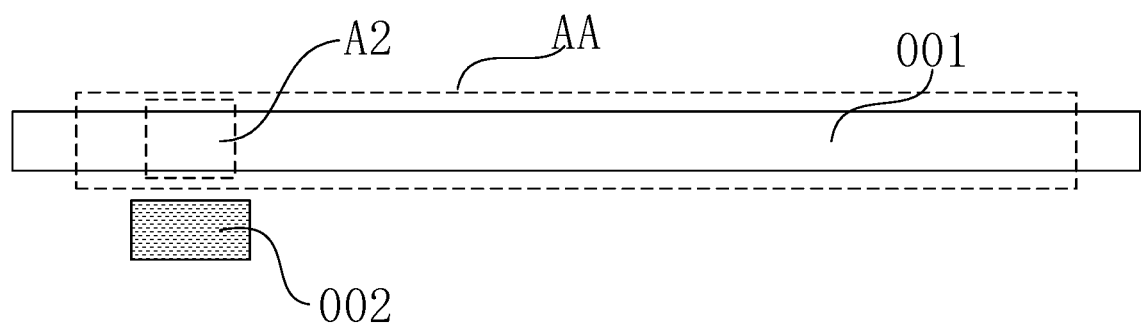
FIG. 15 is a schematic diagram of a display apparatus according to an embodiment of the present disclosure.

FIG. 15 is a schematic diagram of a display apparatus according to an embodiment of the present disclosure. As shown in FIG. 15, the display apparatus according to the present disclosure includes a display panel 001 according to any of the foregoing embodiments. As shown in FIG. 15, the display apparatus according to the present disclosure may be a mobile phone, and the display apparatus provided in the present disclosure may also be a display apparatus such as a computer or a television.

In the display apparatus according to the present disclosure, the second pixel driving circuits 22 in the light-transmitting display area A2 of the display panel are centralized to a certain extent, thus the light-transmitting display area A2 has a relatively high light transmittance, then a position of the display apparatus corresponding to the light-transmitting display area A2 has an excellent light collection performance.

In addition, the display apparatus according to the present disclosure further includes a camera 002, and the camera 002 is provided on a side of the light-transmitting display area A2 of the display panel 001 facing away from a light-emitting surface, then light beams required for imaging by the camera 002 may be transmitted from the light-emitting surface of the display panel 001 through the light-transmitting display area A2. Optionally, the camera 002 is provided corresponding to the high-light-transmitting display area.

Since in the display apparatus according to the present disclosure, the second pixel driving circuits 22 in the light-transmitting display area A2 of the display panel are centralized to a certain extent, the light-transmitting display area A2 has a relatively high light transmittance, such that the display apparatus has a good photographing effect.

The above are only the preferred embodiments of the present disclosure and are not intended to limit the present disclosure. Any modifications, equivalents, improvements, etc., which are made within the spirit and principles of the present disclosure, should be included in the scope of the present disclosure.

What is claimed is:

1. A display panel, comprising:
a first display area comprising a plurality of first light-emitting devices and a plurality of first pixel driving circuits, wherein each of the plurality of light-emitting devices is electrically connected to one of the plurality of first pixel driving circuits;
a light-transmitting display area comprising a plurality of second light-emitting devices and a plurality of second pixel driving circuits, wherein each of the second light-emitting devices is electrically connected to one of the plurality of second pixel driving circuits,
wherein the second pixel driving circuits electrically connected to the second light-emitting devices in at least two columns are located in the same column, and the second pixel driving circuits located in the same column and connected to the second light-emitting devices in different columns are respectively connected to different data signal wires.

2. The display panel according to claim 1, wherein the second pixel driving circuits electrically connected to the second light-emitting devices in one column and the second pixel driving circuits electrically connected to the second light-emitting devices in another column are arranged in the same column.

3. The display panel according to claim 1, wherein among the second light-emitting devices and the first light-emitting devices in the same column, the second pixel driving circuits electrically connected to the second light-emitting devices and the first pixel driving circuits electrically connected to the first light-emitting devices are electrically connected to the same data signal wire.

4. The display panel according to claim 1, wherein among the second light-emitting devices and first light-emitting devices in the same row, the second pixel driving circuits electrically connected to the second light-emitting devices and the first pixel driving circuits electrically connected to the first light-emitting devices are electrically connected to the same scan wire.

5. The display panel according to claim 1, wherein the light-transmitting display area comprises a second display area and a third display area, the second display area is located between the first display area and the third display area, and the plurality of second pixel driving circuits are all arranged in the second display area.

6. The display panel according to claim 5, wherein each second light-emitting device located in the third display area is electrically connected to a corresponding second pixel driving circuit of the plurality of second pixel driving circuits through a connecting electrode which is a transparent conductive electrode.

7. The display panel according to claim 5, wherein the second light-emitting devices in N adjacent rows are arranged in a staggered manner, and the second pixel driving circuits in one column comprise a first-type pixel driving circuit to an Nth-type pixel driving circuit; the first-type pixel driving circuit to the Nth-type pixel driving circuit located in the same column are respectively electrically connected to a first data signal wire to an Nth data signal wire and are respectively connected to the second light-emitting devices in N columns in the third display area, where $N \geq 2$, and N is a positive integer.

8. The display panel according to claim 5, wherein the second pixel driving circuits electrically connected to at least two second light-emitting devices in the same row in the third display area are arranged in the same column.

9. The display panel according to claim 8, wherein each of the plurality of second pixel driving circuits comprises a plurality of transistors;
gates of respective transistors having the same function in the second pixel driving circuits electrically connected to the second light-emitting devices of the same color in the same row are electrically connected to each other.

10. The display panel according to claim 1, wherein the plurality of first pixel driving circuits and the plurality of second pixel driving circuits each comprise a plurality of transistors, and an area of the second pixel driving circuit is smaller than an area of the first pixel driving circuit.

11. The display panel according to claim 10, wherein the first pixel driving circuit has more transistors than the second pixel driving circuit.

12. The display panel according to claim 10, wherein the plurality of first pixel driving circuits and the plurality of second pixel driving circuits each comprise a plurality of transistors, the plurality of transistors each comprise a gate and a source, and the gate and the source are located in different metal layers; and
at least one of the data signal wires corresponding to the second pixel driving circuits in the same column is located in a different metal layer from the gate and the source.

13. The display panel according to claim 12, further comprising a touch layer, the touch layer comprising a touch electrode layer and a touch trace layer, wherein the touch electrode layer comprises a plurality of touch electrodes insulated from each other, and the touch trace layer comprises a plurality of touch traces; each of the plurality of touch electrodes is electrically connected to at least one of the plurality of touch traces; and
at least one of the data signal wires corresponding to the second pixel driving circuits in the same column is arranged in the same layer as the plurality of touch traces.

14. The display panel according to claim 1, wherein the data signal wires corresponding to the second pixel driving circuits in the same column comprise a first data signal wire and a second data signal wire; the second data signal wires and the first data signal wires corresponding to the second pixel driving circuits in the same column at least partially overlap each other along a thickness direction of the display panel.

15. The display panel according to claim 1, wherein the data signal wires corresponding to the second pixel driving circuits in the same column comprise a first data signal wire and a second data signal wire, wherein at least one of the first data signal wire and the second data signal wire overlap at least part of the second pixel driving circuits along a thickness direction of the display panel.

16. The display panel according to claim 1, wherein each of the plurality of second pixel driving circuits comprises a data signal writing transistor;

the data signal writing transistors comprised in the second pixel driving circuits in the same column are located between two data signal wires corresponding to the second pixel driving circuits in the column.

17. A display apparatus, comprising a display panel, wherein the display panel comprises:

a first display area comprising a plurality of first light-emitting devices and a plurality of first pixel driving circuits, wherein each of the plurality of light-emitting devices is electrically connected to one of the plurality of first pixel driving circuits;

a light-transmitting display area comprising a plurality of second light-emitting devices and a plurality of second pixel driving circuits, wherein each of the second light-emitting devices is electrically connected to one of the plurality of second pixel driving circuits, wherein the second pixel driving circuits electrically connected to the second light-emitting devices in at least two columns are located in the same column, and the second pixel driving circuits located in the same column and connected to the second light-emitting devices in different columns are respectively connected to different data signal wires.

18. A display panel comprising:

a first display area comprising a plurality of first light-emitting devices and a plurality of first pixel driving circuits, wherein each of the plurality of light-emitting devices is electrically connected to one of the plurality of first pixel driving circuits;

a light-transmitting display area comprising a plurality of second light-emitting devices and a plurality of second pixel driving circuits, wherein each of the second light-emitting devices is electrically connected to one of the plurality of second pixel driving circuits, wherein along a column direction, a density of the plurality of second pixel driving circuits is greater than a density of the plurality of first pixel driving circuits.

19. The display panel according to claim 18, wherein the second pixel driving circuits electrically connected to the second light-emitting devices in one column and the second pixel driving circuits electrically connected to the second light-emitting devices in another column are arranged in the same column.

20. A display apparatus, comprising a display panel, wherein the display panel comprises:

a first display area comprising a plurality of first light-emitting devices and a plurality of first pixel driving circuits, wherein each of the plurality of light-emitting devices is electrically connected to one of the plurality of first pixel driving circuits;

a light-transmitting display area comprising a plurality of second light-emitting devices and a plurality of second pixel driving circuits, wherein each of the second light-emitting devices is electrically connected to one of the plurality of second pixel driving circuits, wherein along a column direction, a density of the plurality of second pixel driving circuits is greater than a density of the plurality of first pixel driving circuits.

* * * * *